(12) United States Patent
Noda

(10) Patent No.: US 7,170,113 B2
(45) Date of Patent: Jan. 30, 2007

(54) SEMICONDUCTOR DEVICE AND METHOD OF MANUFACTURING THE SAME

(75) Inventor: Noboru Noda, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 10/813,446

(22) Filed: Mar. 31, 2004

(65) Prior Publication Data
US 2005/0001289 A1    Jan. 6, 2005

(30) Foreign Application Priority Data
Apr. 1, 2003 (JP) ............................... 2003-097720

(51) Int. Cl.
*H01L 29/739* (2006.01)
(52) U.S. Cl. ..................... 257/197; 257/588; 257/592
(58) Field of Classification Search ................ 257/197, 257/198, 565, 592, 588
See application file for complete search history.

(56) References Cited

U.S. PATENT DOCUMENTS
6,043,552 A * 3/2000 Miwa ........................ 257/587

FOREIGN PATENT DOCUMENTS

| JP | 60-235464 A | 11/1985 |
|---|---|---|
| JP | 61-042138 A | 2/1986 |
| JP | 63-193562 A | 8/1988 |
| JP | 03-022440 A | 1/1991 |
| JP | 4-294543 A | 10/1992 |
| JP | 11-233523 A | 8/1999 |
| JP | 2001-068479 A | 3/2001 |
| JP | 2002-270819 A | 9/2002 |

* cited by examiner

*Primary Examiner*—Sara Crane
(74) *Attorney, Agent, or Firm*—Foley & Lardner LLP

(57) ABSTRACT

An aspect of a semiconductor device includes: a collector layer of first conductive type formed on a semiconductor substrate; a graft base layer of second conductive type formed in a surface region of the collector layer; a first base leading-out region of second conductive type formed on the graft base layer; a second base leading-out region of second conductive type formed on an upper surface and a side surface of the first base leading-out region; a base layer of second conductive type formed on the collector layer; an emitter layer of first conductive type formed in a surface region of the base layer; and an emitter leading-out region formed on the emitter layer.

5 Claims, 12 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2003-97720, filed on Apr. 1, 2003 in Japan, the entire contents of which are incorporated herein by reference.

BACKGROUND OF THE INVENTION

1. Field of the Invention

The present invention relates to a semiconductor device and a method of manufacturing the same, and particularly to a semiconductor device comprising a bipolar transistor.

2. Related Art

In recent years, in a semiconductor device used at a high frequency is strongly required improvement in frequency characteristics such as a current gain bandwidth product $f_T$ and a maximum oscillation frequency $f_{max}$ or improvement in noise characteristics such as a noise factor NF. Further, a high break down voltage ($V_{CEO}$) between a collector and an emitter is required in harmony with actual use of high power supply.

FIG. 9 shows an NPN bipolar transistor according to a conventional technique. An N-type collector layer 902 made of a silicon layer is formed on an N-type silicon substrate 901. Further, an element isolating region 903 made of an oxide film is formed in a region other than element forming portions by a LOCOS (Local Oxidation of Silicon) process, and a thin oxide film 904 is formed on part of the N-type collector layer 902. Further, a base leading-out region 905 made of polycrystalline silicon is formed on the oxide film 904 on the N-type collector layer 902 and the element isolating region 903. A P-type base layer 906 made of a SiGe layer is formed on the base leading-out region 905 and the N-type collector layer 902. It is also possible to form a P-type base layer made of a silicon layer without adding Ge.

An N-type emitter layer 907 is selectively formed in a surface region of the P-type base layer 906 on the N-type collector layer 902. Interlayer dielectrics 908 and 909 provided with an opening for contact hole are formed on the P-type base layer 906, and an emitter leading-out region 910 made of polycrystalline silicon is formed on the N-type emitter layer 907. The emitter leading-out region 910 and the P-type base layer 906 are electrically insulated from each other by the interlayer dielectric 908.

Furthermore, an emitter electrode 911 and a base electrode 912 are formed on the emitter leading-out region 910 and the base leading-out region 905 by embedding a conductive material in the openings for contact hole.

Next, FIG. 10A to FIG. 12 show a method for manufacturing the NPN bipolar transistor according to the conventional technique. As shown in FIG. 10A, the N-type collector layer 902 made of a silicon layer is formed on the N-type silicon substrate 901 by epitaxially growing the silicon while adding N-type impurities. Subsequently, the element isolating region 903 made of an oxide film is formed in a region other than element forming portions by the LOCOS (Local Oxidation of Silicon) process, and the thin oxide film 904 is formed on the N-type collector layer 902.

Next, as shown in FIG. 10B, a polycrystalline silicon layer 913 is formed on the element isolating region 903 and the oxide film 904. Subsequently, the polycrystalline silicon layer 913 and the oxide film 904 are etched such that part of the N-type collector layer 902 is exposed. Etching of the oxide film 904 is performed by wet-etching. Next, P-type impurities are ion-implanted into the polycrystalline silicon layer 913 to form the base leading-out region 905.

Next, as shown in FIG. 10C, the P-type base layer 906 made of a silicon layer is formed on the base leading-out region 905 and the N-type collector layer 902 by epitaxially growing the silicon while adding the p-type impurities. Here, the P-type base layer made of a SiGe layer may be formed by epitaxially growing the silicon while adding the P-type impurities and Ge.

Next, as shown in FIG. 11A, the interlayer dielectric 908 is formed on the P-type base layer 906, and the interlayer dielectric 908 is etched such that part of the P-type base layer 906 formed on the N-type collector layer 902 is exposed. Subsequently, a polycrystalline silicon layer 914 is formed on the interlayer dielectric 908 and the exposed P-type base layer 906, and the emitter leading-out region 910 is formed and the N-type emitter layer 907 is formed in part of the surface region of the P-type base layer 906 by ion-implanting the N-type impurities into the polycrystalline silicon layer 914 and performing thermal processing.

Next, as shown in FIG. 11B, the interlayer dielectric 909 is formed on the base leading-out region 905 and the emitter leading-out region 910. The base electrode 912 and the emitter electrode 911 connected to the base leading-out region 905 and the emitter leading-out region 910 respectively are formed by forming openings such that part of the base leading-out region 905 and part of the emitter leading-out region 910 are exposed, and embedding a conductive material in the openings. Japanese Patent Application Laid-Open No. 11-233523 is known as one example of the semiconductor device comprising such an NPN bipolar transistor.

In FIG. 10C, in the case of forming the P-type base layer 906 by epitaxial growth, thermal processing at about 600° C. is generally performed. At this time, the P-type impurities ion-implanted into the base leading-out region 905 are scattered to the neighboring P-type base layer 906 as shown by arrows in FIG. 10C, and an abnormal profile of the P-type impurities is formed near the interface between the P-type base layer 906 and the N-type collector layer 902.

FIG. 12 shows an impurity concentration across B–B' section, and this abnormal profile of the P-type impurities is called a P-type auto-doped layer 1301. Since the P-type auto-doped layer 1301 is generated so that a width of the base layer is substantially widened, there is a problem that a base traveling time of carriers is increased and the frequency characteristics are deteriorated. This P-type auto-doped layer 1301 is mainly formed by the thermal processing at the time of forming the P-type base layer 906 by epitaxial growth, but can be formed by thermal processing in other step. Further, even when the P-type base layer 906 is not formed by epitaxial growth, the layer may be formed by other thermal process.

Further, in a semiconductor device having an N-type collector layer which does not have a relatively low concentration, even when the P-type impurities are diffused near the interface between the P-type base layer and the N-type collector layer, the P-type auto-doped layer is not formed substantially because the N-type collector layer does not have the relatively low concentration. Here, the relatively low concentration refers to, for example, $3 \times 10^{16}$ cm$^{-3}$.

Therefore, there is a problem that the deterioration of the frequency characteristics due to the P-type auto-doped layer formed near the interface between the P-type base layer and the N-type collector layer notably occurs especially in the semiconductor device having the N-type collector layer which has the relatively low impurity concentration requiring a high breakdown voltage. Conventionally, there has been a problem that the impurity concentration of the N-type collector layer cannot be set to be relatively low in order to prevent the deterioration of the frequency characteristics due to the P-type auto-doped layer so that a breakdown voltage cannot be improved.

Further, in the case of adding Ge to form the P-type base layer made of a SiGe layer at the time of epitaxially growing the base layer, it is possible to alleviate an energy barrier of hetero junction and to enhance the degree of movement of carriers, thereby improving the frequency characteristics. However, since the energy barrier occurs between the P-type auto-doped layer and the N-type collector layer as a result of forming the P-type auto-doped layer 1301, there is a problem that when the base layer is formed by using Ge, the width of the base layer is substantially widened so that the base traveling time is increased to reduce implantation efficiency and the frequency characteristics are further deteriorated.

SUMMARY OF THE INVENTION

A semiconductor device according to a first aspect of the present invention includes: a collector layer of first conductive type formed on a semiconductor substrate; a graft base layer of second conductive type formed in a surface region of the collector layer; a first base leading-out region of second conductive type formed on the graft base layer; a second base leading-out region of second conductive type formed on an upper surface and a side surface of the first base leading-out region; a base layer of second conductive type formed on the collector layer; an emitter layer of first conductive type formed in a surface region of the base layer; and an emitter leading-out region formed on the emitter layer.

A method for manufacturing a semiconductor device according to a second aspect of the present invention includes: forming a collector layer of first conductive type in a semiconductor substrate; forming a first base leading-out region to which impurities of second conductive type are added on the collector layer to form a non-doped region on upper surface and a side surface of the first base leading-out region; forming a base layer of second conductive type on the non-doped region and the collector layer; thermally diffusing the impurities of second conductive type in the first base leading-out region into the non-doped region and the collector layer immediately below the first base leading-out region; forming an emitter layer of first conductive type in a surface region of the base layer; and forming an emitter leading-out region on the emitter layer.

A method for manufacturing a semiconductor device according to a third aspect of the present invention includes: forming a collector layer of first conductive type in a semiconductor substrate; forming an element isolating region in the collector layer; forming a dielectric pattern on part of the collector layer; forming a first base leading-out region to which impurities of second conductive type are added on the collector layer where the dielectric pattern is not formed to form a first non-doped region on the first base leading-out region; removing the dielectric pattern by wet-etching; forming a second non-doped region on a side surface of the first base leading-out region and a side surface of the first non-doped region; forming a base layer of second conductive type on the first and second non-doped regions and the collector layer; thermally diffusing the impurities of second conductive type in the first base leading-out region into the first and second non-doped regions and the collector layer immediately below the first base leading-out region; forming an emitter layer of first conductive type in a surface region of the base layer; and forming an emitter leading-out region on the emitter layer.

DESCRIPTION OF THE INVENTION

Hereinafter, an embodiment according to the present invention will be described in detail with reference to the drawings.

(First Embodiment)

Figure 1:
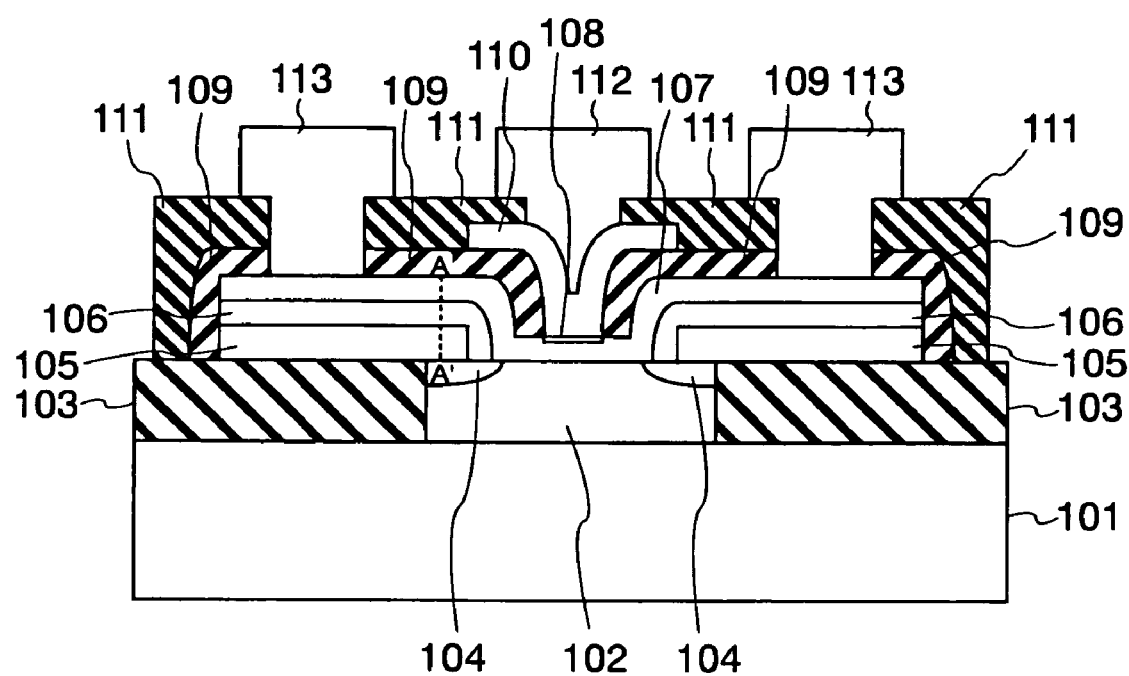
FIG. 1 is a section view of essential part showing a semiconductor device according to a first embodiment of the present invention.

FIG. 1 shows an NPN bipolar transistor according to the present embodiment. An N-type collector layer 102 made of a silicon layer is formed on an N-type silicon substrate 101.

An element isolating region 103 is formed in a region other than element forming portions through a STI (Shallow Trench Isolation) process by etching the silicon layer and embedding a dielectric such as an oxide film. Further, the element isolating region 103 may be formed through a LOCOS (Local Oxidation of Silicon) process. In the case of the LOCOS process, an element isolating region 103 made of a dielectric such as an oxide film is formed in a region other than the element forming portions, and a thin dielectric formed on the N-type collector layer is removed. Further, a P-type graft base layer 104 is formed in a surface region of the N-type collector layer 102.

Further, a first base leading-out region 105 made of polycrystalline silicon is formed on the N-type collector layer 102 and part of the element isolating region 103, and a second base leading-out region 106 made of polycrystalline silicon is formed on the first base leading-out region 105. A P-type base layer 107 containing SiGe is formed on the second base leading-out region 106 and the N-type collector layer 102 by non-selective epitaxial growth. At this time, it is possible to form a P-type base layer made of a polycrystalline silicon layer and a silicon layer without adding Ge.

An N-type emitter layer 108 is selectively formed in a surface region of the P-type base layer 107 on the N-type collector layer 102. An interlayer dielectric 109 is formed on the P-type base layer 107, and an emitter leading-out region 110 made of polycrystalline silicon is formed on the N-type emitter layer 108. The emitter leading-out region 110 and the P-type base layer 107 are electrically insulated from each other by the interlayer dielectric 109.

Further, an interlayer dielectric 111 provided with an opening for contact hole is formed on the emitter leading-out region 110 and the second base leading-out region 106, and an emitter electrode 112 and a base electrode 113 are formed by embedding a conductive material in this opening.

Figure 2A:
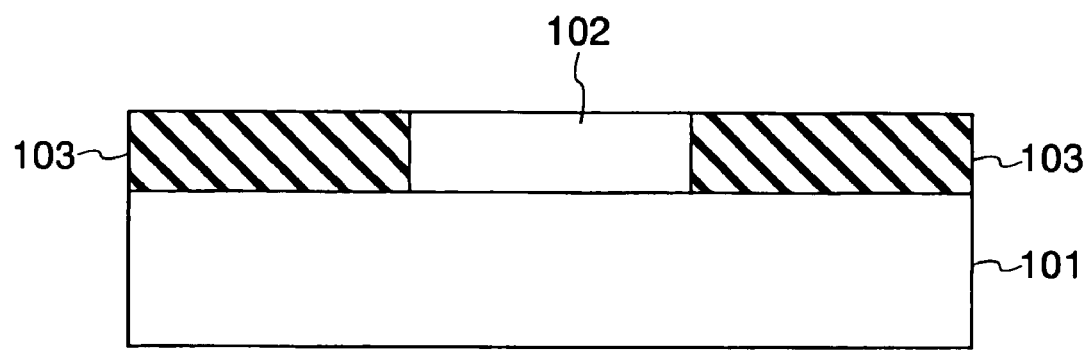
FIGS. 2A to 2B are section views of essential part showing one step of a method for manufacturing the semiconductor device according to the first embodiment of the present invention.

Next, FIG. 2A to FIG. 4B show a method for manufacturing an NPN bipolar transistor according to the present embodiment. As shown in FIG. 2A, the N-type collector layer 102 made of a silicon layer is formed on the N-type silicon substrate 101 by epitaxially growing the silicon while adding N-type impurities. Subsequently, the element isolating region 103 is formed by etching a region other than element forming portions and embedding a dielectric such as an oxide film.

Figure 2B:
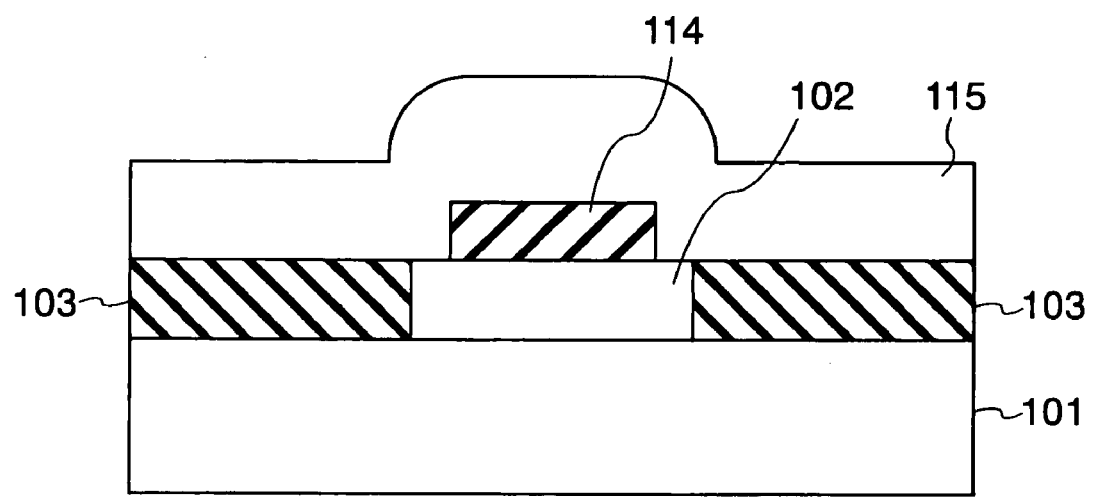

Next, as shown in FIG. 2B, a dummy dielectric 114 made of an oxide film is formed on part of the N-type collector layer 102. The dummy dielectric 114 is not limited to an oxide film, and is not particularly limited to a laminated film of nitride film/oxide film/nitride film, and the like. A polycrystalline silicon layer 115 is formed on the N-type collector layer 102, the dummy dielectric 114, and the element isolating region 103.

Figure 3A:
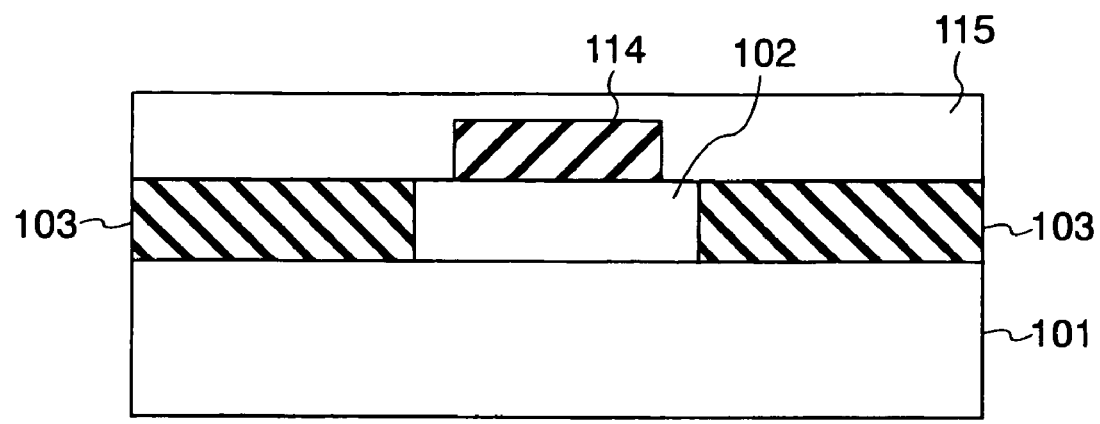
FIGS. 3A to 3B are section views of essential part showing one step of the method for manufacturing the semiconductor device according to the first embodiment of the present invention.

Next, as shown in FIG. 3A, the polycrystalline silicon layer 115 is etched back by a RIE (Reactive Ion Etching). The polycrystalline silicon layer 115 may be polished by a CMP (Chemical Mechanical Polishing).

Figure 3B:
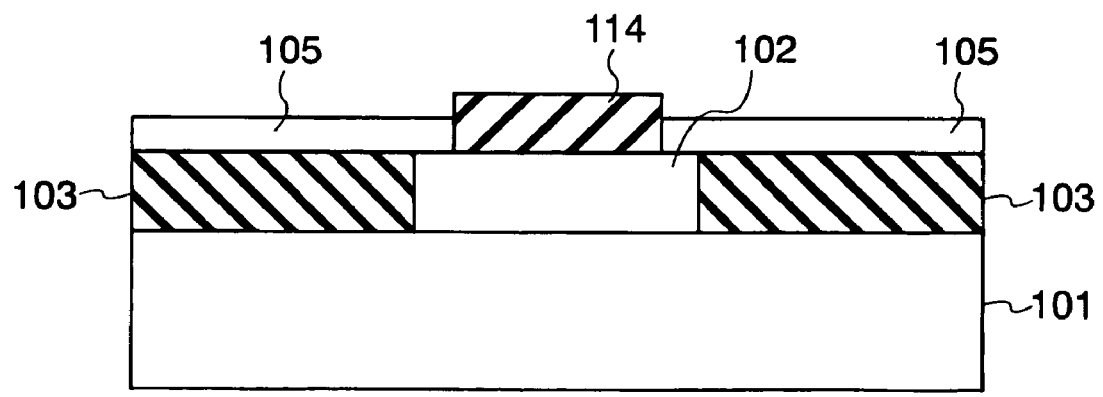

Next, as shown in FIG. 3B, providing an etching rate difference between the polycrystalline silicon layer 115 and the dummy dielectric 114, the polycrystalline silicon layer 115 is etched and an upper surface and part of a side surface of the dummy dielectric 114 are exposed to form a convex shape of the dummy dielectric 114. Subsequently, P-type impurities are ion-implanted, and the first base leading-out region 105 is formed at the polycrystalline silicon layer 115.

Figure 4A:
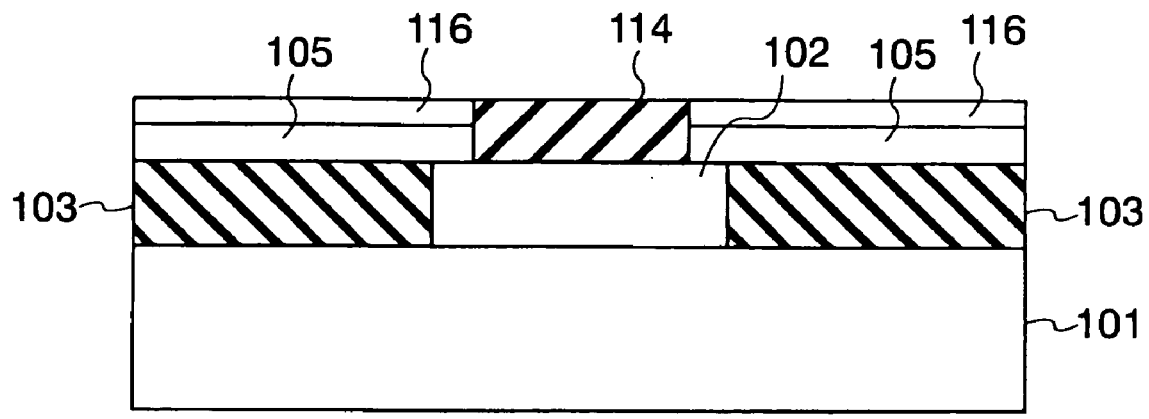
FIGS. 4A to 4B are section views of essential part showing one step of the method for manufacturing the semiconductor device according to the first embodiment of the present invention.

Next, as shown in FIG. 4A, a polycrystalline silicon layer 116 is formed on the first base leading-out region 105 and the dummy dielectric 114 to expose the surface of the dummy dielectric 114, and the polycrystalline silicon layer 116 is etched back by the RIE (Reactive Ion Etching) such that the surface of the first base leading-out region 105 is not exposed. The polycrystalline silicon layer 116 may be polished by the CMP (Chemical Mechanical Polishing). Further, in the step of exposing the surface of the dummy dielectric 114, the surface of the dummy dielectric 114 may be grinded by etching or polishing.

Figure 4B:
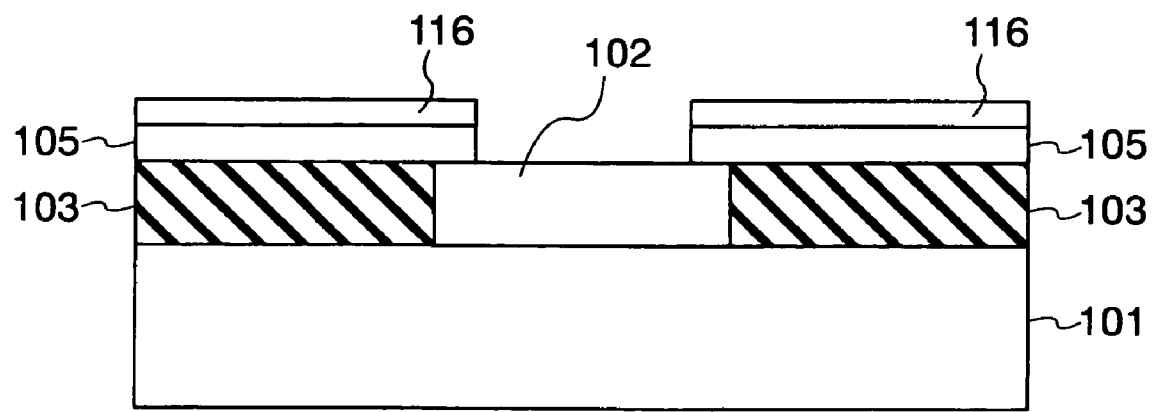

Next, as shown in FIG. 4B, the dummy dielectric 114 is removed by wet-etching to expose the surface of the N-type collector layer 102. At the time of exposing the surface of the N-type collector layer 102, when etching is performed by the RIE, impact on the surface of the N-type collector layer is large so that a surface defect or the like which causes a leakage current easily occurs. Therefore, in the step of forming a pattern of the base leading-out region using the dummy dielectric 114 and removing the dummy dielectric 114 by wet-etching, it is effective that a surface defect hardly occurs.

Figure 5A:
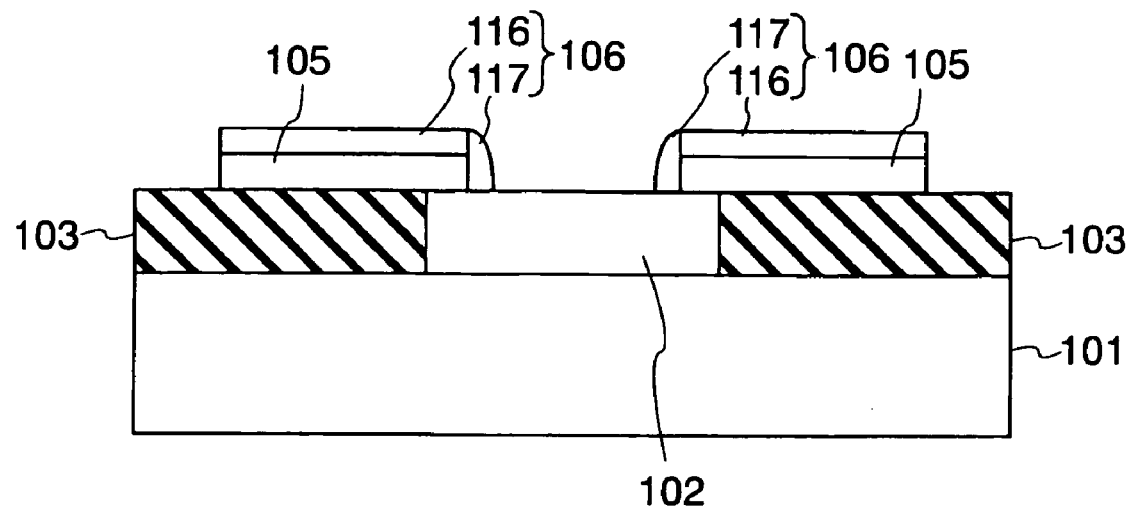
FIGS. 5A to 5B are section views of essential part showing one step of the method for manufacturing the semiconductor device according to the first embodiment of the present invention.

Next, as shown in FIG. 5A, a polycrystalline silicon layer is formed on the polycrystalline silicon layer 116 and the N-type collector layer 102, and subsequently etching is performed by the RIE such that the surfaces of the polycrystalline silicon layer 116 and the N-type collector layer 102 are exposed, and a polycrystalline silicon layer 117 is formed on the side surface of the first base leading-out region 105. The polycrystalline silicon layer 116 and the polycrystalline silicon layer 117 formed on the upper surface and the side surface of the first base leading-out region 105 constitute the second base leading-out region 106 which is a non-doped region. Although etching is performed by the RIE to expose the surface of the N-type collector layer 102 when the polycrystalline silicon layer 117 is formed on the side surface of the first base leading-out region 105, the polycrystalline silicon layer 117 is as relatively thin as one layer so that a defect due to the RIE which occurs on the surface of the N-type collector layer 102 is as small as can be corrected.

Figure 5B:
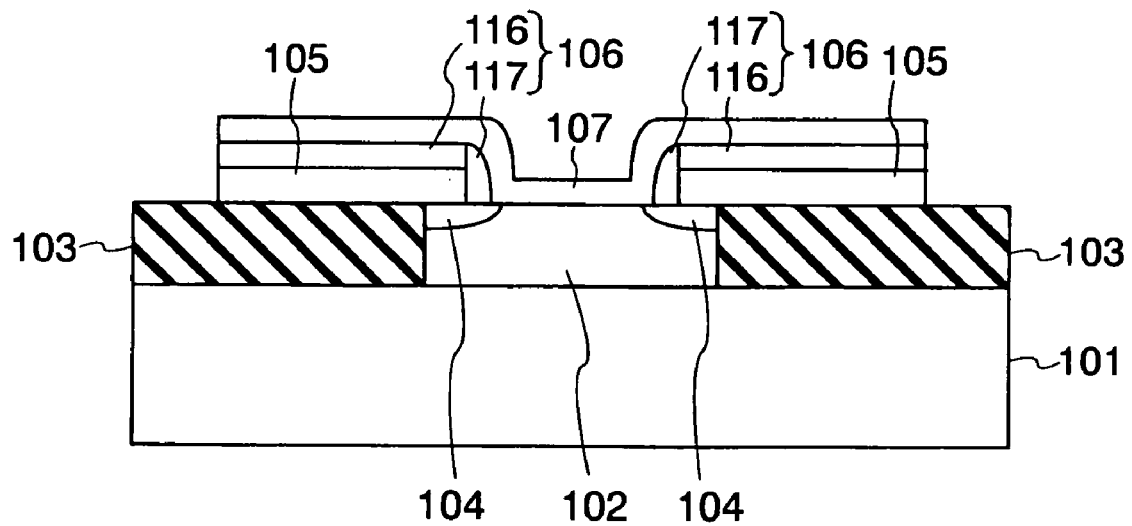

Next, as shown in FIG. 5B, the P-type base layer 107 made of a SiGe layer is formed on the second base leading-out region 106 and the N-type collector layer 102 by non-selective epitaxial growth while adding the P-type impurities and Ge. Further, it is possible to form the P-type base layer made of a polycrystalline silicon layer and a silicon layer without adding Ge. Further, it is also possible to form the P-type base layer 107 made of a SiGe layer or a silicon layer by the non-selective epitaxial growth.

When the thermal processing at a low temperature is performed in the case of forming the P-type base layer 107 by the epitaxial growth, the P-type impurities ion-implanted into the first base leading-out region 105 are diffused into the N-type collector layer 102 formed so as to contact the lower surface of the first base leading-out region 105 as shown in FIG. 5B, and the P-type graft base layer 104 is formed in the surface region of the N-type collector region 102. Furthermore, the P-type impurities ion-implanted into the first base leading-out region 105 are also diffused into the second base leading-out region 106 which is the non-doped region formed so as to contact the upper surface and the side surface of the first base leading-out region 105 as shown in FIG. 5B.

Figure 6A:
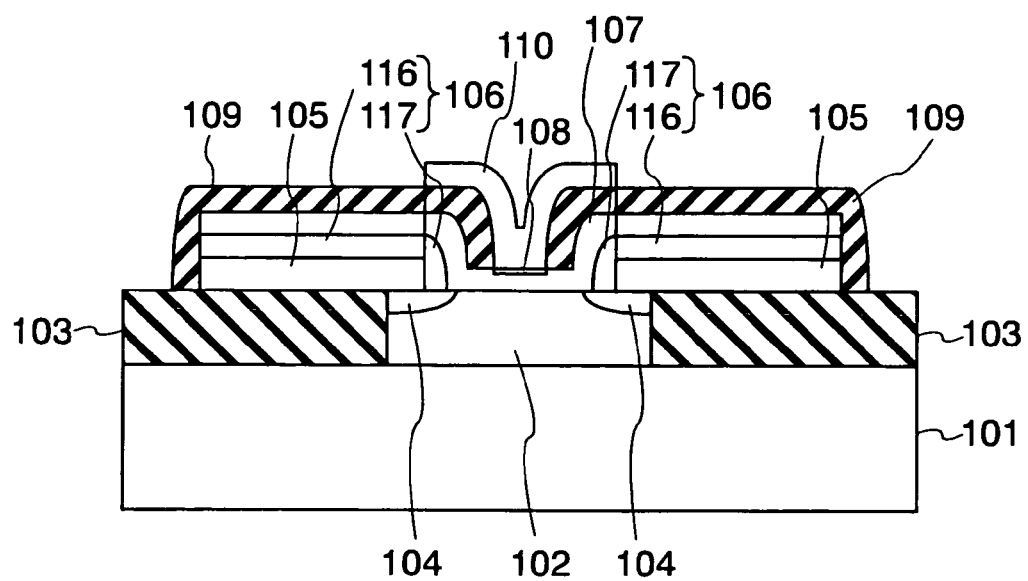
FIGS. 6A to 6B are section views of essential part showing one step of the method for manufacturing the semiconductor device according to the first embodiment of the present invention.

Next, as shown in FIG. 6A, the interlayer dielectric 109 is formed on the P-type base layer 107, and the interlayer dielectric 109 is etched such that part of the P-type base layer 107 formed on the N-type collector layer 102 is exposed. Subsequently, a polycrystalline silicon layer is formed on the interlayer dielectric 109 and the exposed P-type base layer 107, and the thermal processing is performed by ion-implanting the N-type impurities into this polycrystalline silicon layer so that the emitter leading-out region 110 made of polycrystalline silicon is formed and the N-type emitter layer 108 is formed in part of the surface region of the P-type base layer 107.

Figure 6B:
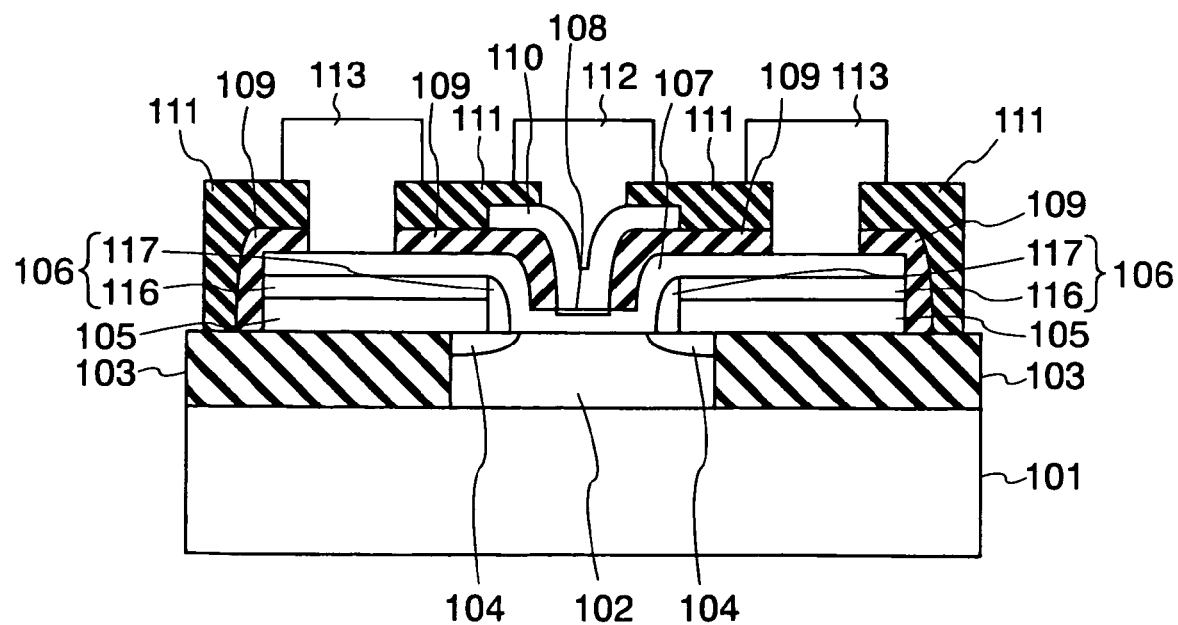

Next, as shown in FIG. 6B, the interlayer dielectric 111 is formed on the second base leading-out region 106 and the emitter leading-out region 110. Openings are formed such that part of the second base leading-out region 106 and part of the emitter leading-out region 110 are exposed, and a conductive material is embedded in the openings, and thus the base electrode 113 and the emitter electrode 112 connected to the base leading-out regions 106, 107 respectively and the emitter leading-out region 110 are formed.

Figure 7:
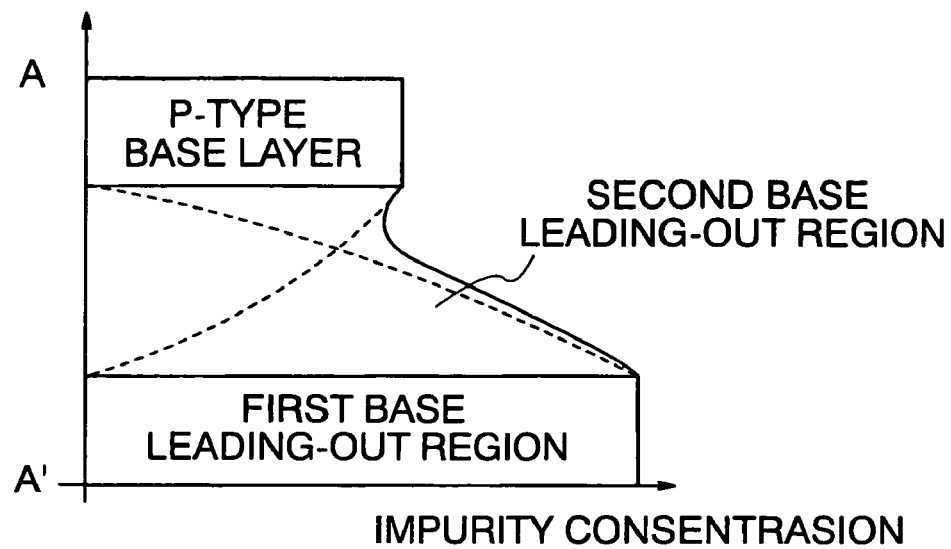
FIG. 7 is a diagram showing an impurity concentration across A–A' section of the semiconductor device shown in FIG. 1 according to the first embodiment of the present invention.

FIG. 7 shows an impurity concentration across A–A' section in FIG. 1. An impurity concentration of the P-type base layer is lower than an impurity concentration of the first base leading-out region and is assumed to be $1 \times 10^{18}$ cm$^{-3}$, and the impurity concentration of the first base leading-out region is assumed to be $1 \times 10^{19}$ cm$^{-3}$. The P-type impurities are diffused from both the first base leading-out region which is the lower layer and the P-type base layer which is the upper layer so that the second base leading-out region is formed, and at least part of the impurity concentration profile of the second base leading-out region is smaller than the impurity concentration of the first base leading-out region. Further, the impurity concentration profile of the second base leading-out region is substantially a middle impurity concentration profile between the impurity concentrations of the first base leading-out region which is the lower layer and the P-type base layer which is the upper layer.

According to the present embodiment, the second base leading-out region 106 which is the non-doped region is formed on the upper surface and the side surface of the first base leading-out region into which the P-type impurities are ion-implanted, and the N-type collector layer 102 is formed on the lower surface of the first base leading-out region not via a dielectric before the thermal processing such as forming the P-type base layer. Therefore, at the time of the thermal processing such as forming the P-type base layer, the P-type impurities diffused from the first base leading-out region 105 are mainly diffused into the second base leading-out region and the N-type collector layer 102.

By diffusing the P-type impurities in this manner, the second base leading-out region is interposed between the first base leading-out region 105 and the P-type base layer 107 such that the P-type base layer 107 and the first base leading-out region 105 are made conductive, and the P-type graft base layer is formed in the surface region of the N-type collector layer 102. As formed in this manner, it is possible to prevent the P-type impurities from scattering up to the interface between the P-type base layer 107 and the N-type collector layer 102. Therefore, it is possible to prevent the width of the base layer from substantially being widened and to reduce the deterioration of the frequency characteristics.

Further, in the present embodiment, since the pattern of the polycrystalline silicon is formed by using the dummy dielectric at the time of forming the first and second base leading-out regions, and the first and second base leading-out regions made of the polycrystalline silicon are formed by removing the dummy dielectric through wet-etching, it is possible to reduce impact on the surface of the N-type collector layer due to the etching and to prevent a leakage current.

Further, since when Ge is added at the time of forming the P-type base layer, an energy barrier due to hetero junction is alleviated and the degree of movement of carriers can be enhanced, the frequency can be further improved, which is particularly effective.

Further, in the semiconductor device having the N-type collector layer which does not have a relatively low concentration, since even when the P-type impurities are diffused near the interface between the P-type base layer and the N-type collector layer, the N-type collector layer does not have the relatively low concentration, the P-type auto-doped layer is not substantially formed. Here, the relatively low concentration is, for example, about $3 \times 10^{16}$ cm$^{-3}$. Therefore, there is a problem that the deterioration of the frequency characteristics due to the P-type auto-doped layer formed near the interface between the P-type base layer and the N-type collector layer notably occurs especially in the semiconductor device having the N-type collector layer which has the relatively low impurity concentration requiring a high breakdown voltage. Conventionally, although there has been a problem that in order to prevent the deterioration of the frequency characteristics due to the P-type auto-doped layer, the impurity concentration of the N-type collector layer cannot be set at relatively low and a breakdown voltage cannot be improved, the width of the base layer can be substantially widened even in the N-type collector layer having the relatively low concentration according to the present embodiment so that the deterioration of the frequency characteristics can be reduced and the breakdown voltage can be improved.

Figure 8:
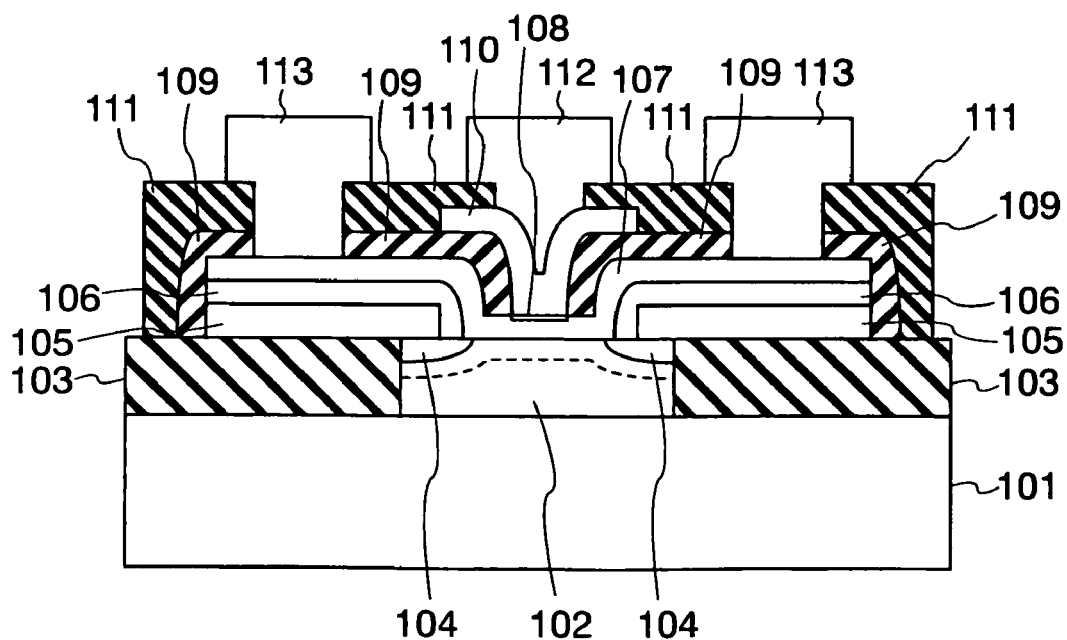
FIG. 8 is a section view of essential part showing a spread of a depletion layer of the semiconductor device according to the first embodiment of the present invention.
Figure 9:
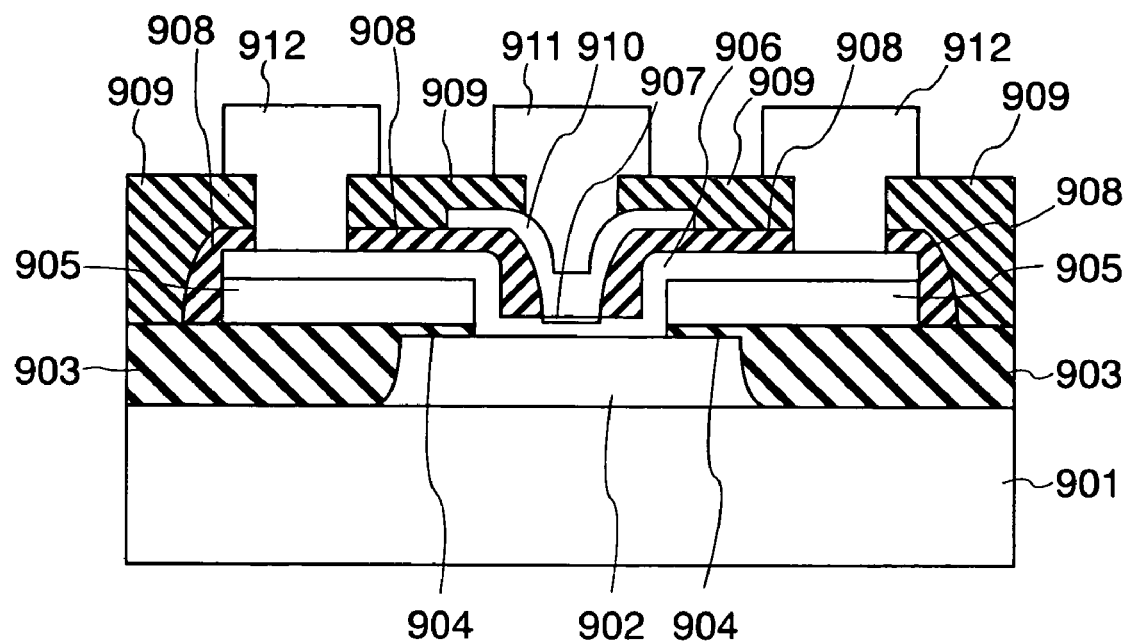
FIG. 9 is a section view of essential part showing a conventional semiconductor device.
Figure 10A:
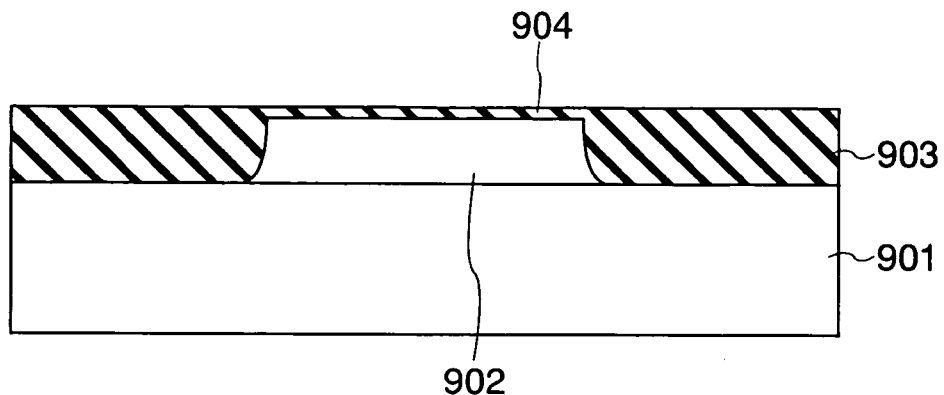
FIGS. 10A to 10C are section views of essential part showing one step of a method for manufacturing the conventional semiconductor device.
Figure 10B:
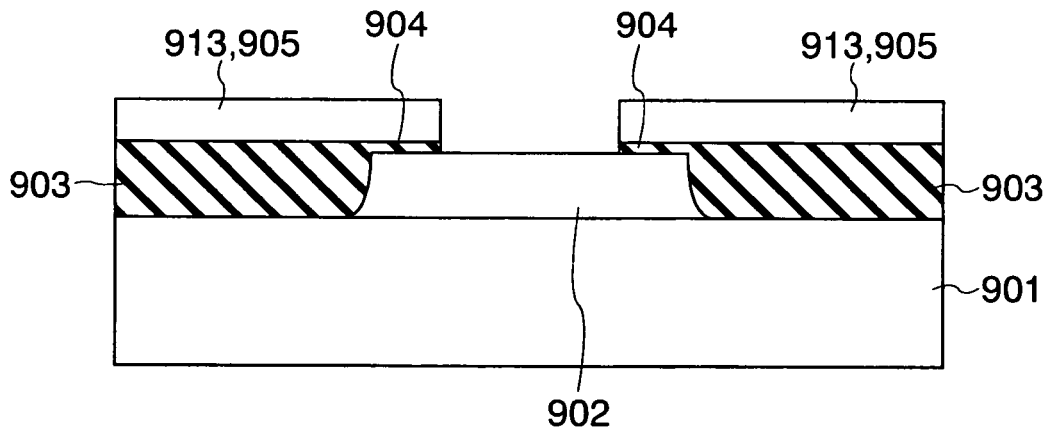
Figure 10C:
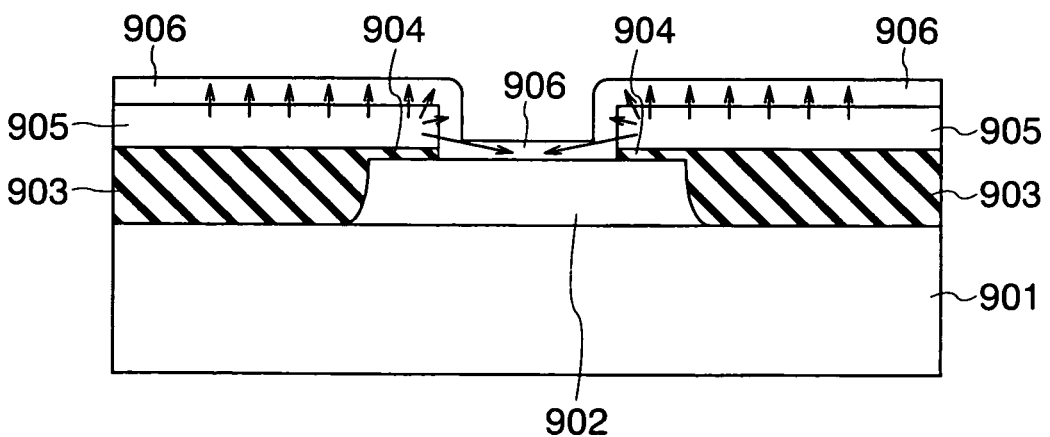
Figure 11A:
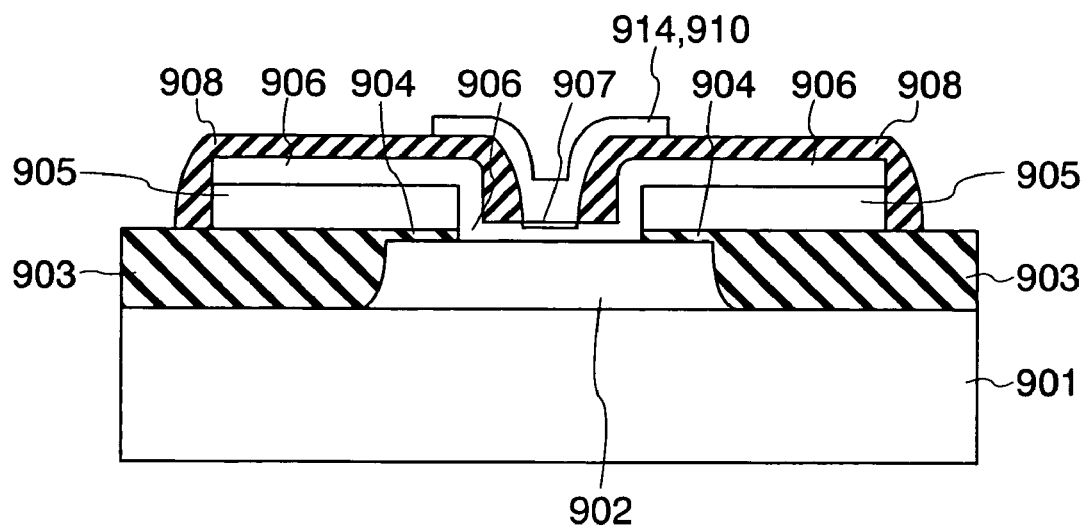
FIGS. 11A to 11B are section views of essential part showing one step of the method for manufacturing the conventional semiconductor device.
Figure 11B:
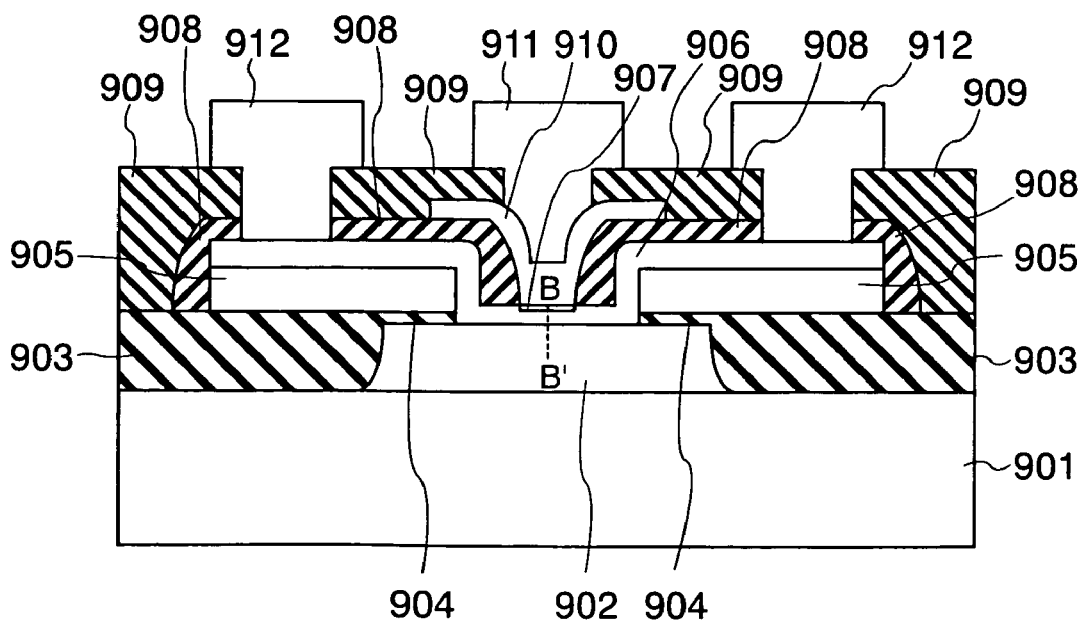
Figure 12:
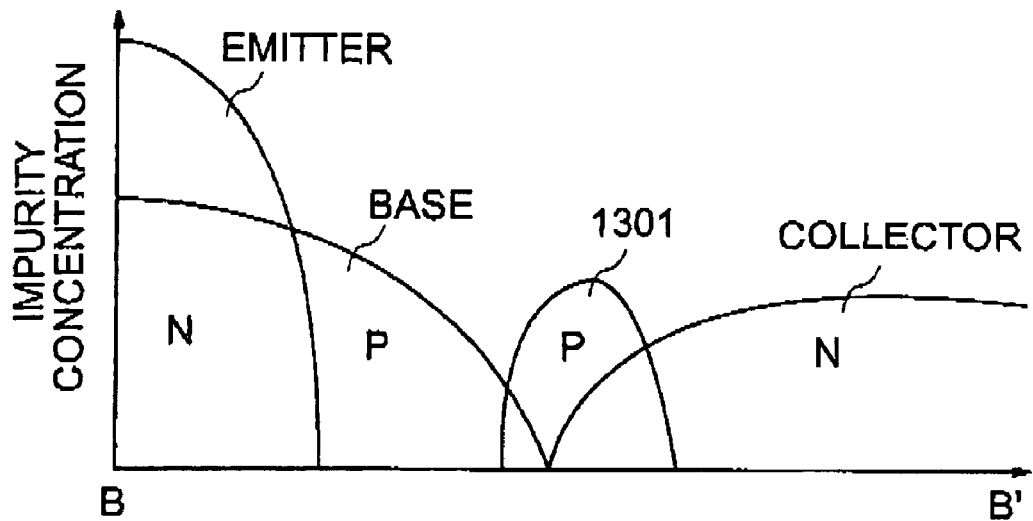
FIG. 12 is a diagram showing an impurity concentration across B–B' section of the conventional semiconductor device shown in FIGS. 11A to 11B.
Figure 13:
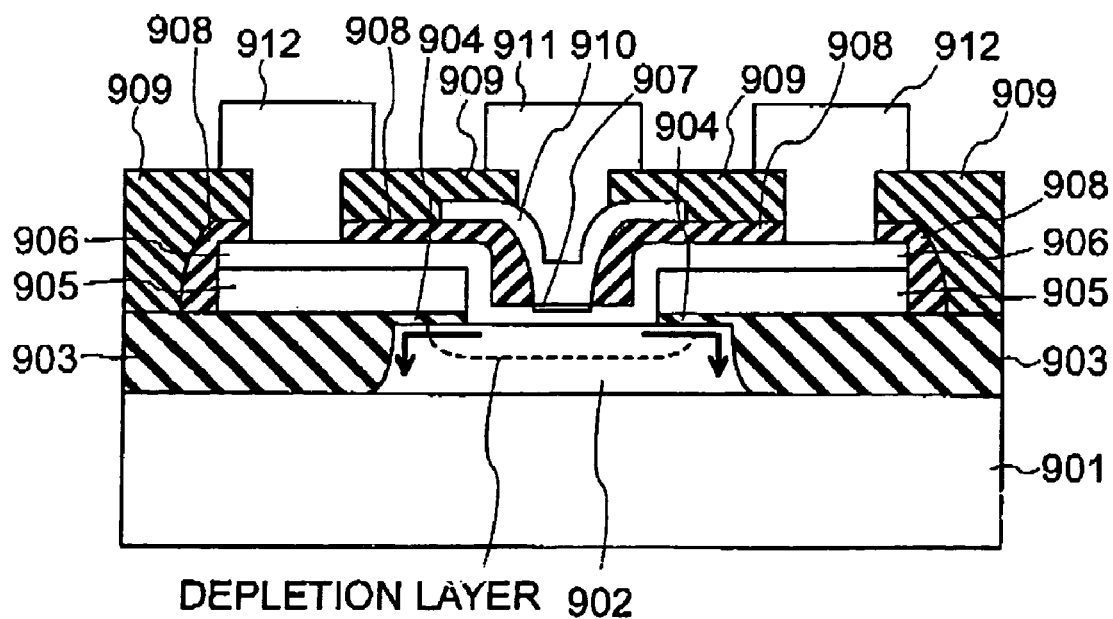
FIG. 13 is a section view of essential part showing a spread of a depletion layer of the conventional semiconductor device.

Further, as shown in FIG. 13, there has been a problem that when the P-type graft base layer is not formed as in the conventional technique, a leakage current as shown by arrows occurs at the interface with the N-type collector layer and the breakdown voltage between the collector and the emitter is deteriorated. As shown in FIG. 8, the P-type graft base layer is formed to cover the region where the leakage current easily occurs and to reduce the leakage current, and the width of the depletion layer is widened and a curvature of the boundary with the depletion layer is alleviated, thereby improving the breakdown voltage. Therefore, it is possible to prevent the width of the base layer from substantially being widened and to improve the breakdown voltage while reducing the deterioration of the frequency characteristics.

Figure 14:
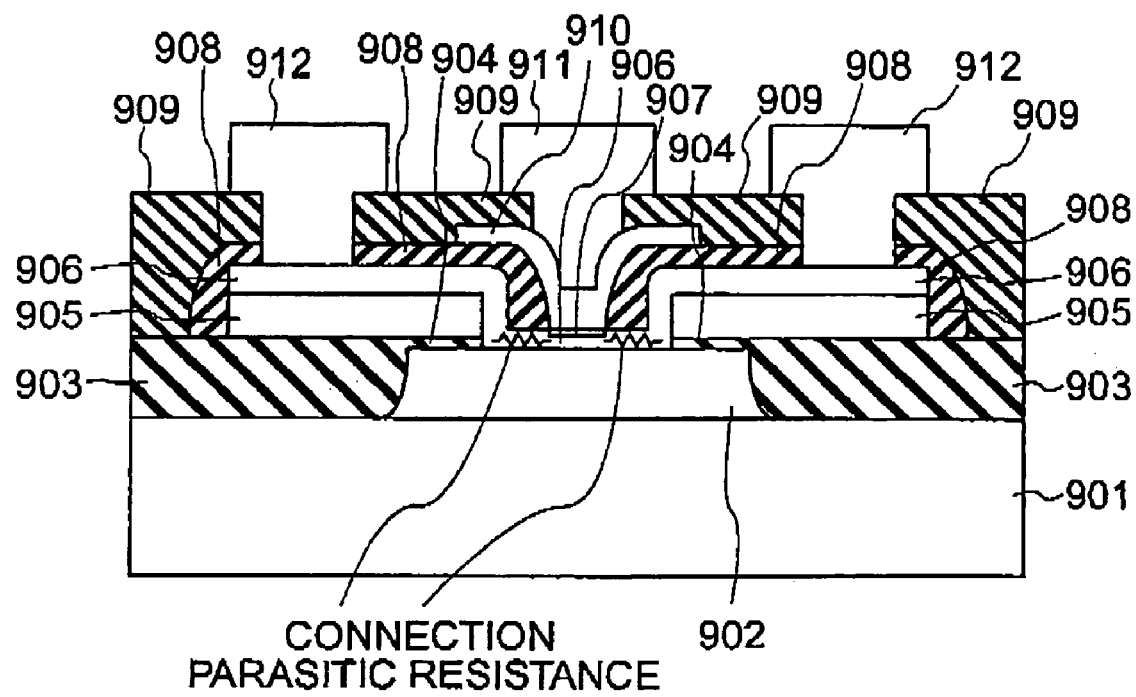
FIG. 14 is a section view of essential part showing a connection parasitic resistance of the conventional semiconductor device.

Further, as shown in FIG. 14, there has been a problem that a connection parasitic resistance between the base leading-out region and the P-type base layer formed on the N-type collector layer is large. Thus, since the P-type graft base layer is formed so that carriers flow through the P-type graft base layer having a low connection resistance, the connection parasitic resistance between the P-type base layer on the P-type collector layer and the base leading-out region can be reduced, thereby improving the noise characteristics.

Furthermore, since the P-type base layer can be formed by the non-selective epitaxial growth so that the connection area between the P-type base layer on the N-type collector layer and the base leading-out region can be enlarged, the connection parasitic resistance can be further reduced, thereby further improving the noise characteristics. Therefore, it is possible to prevent the width of the base layer from substantially being widened and to improve the noise characteristics while reducing the deterioration of the frequency characteristics.

As described above in detail, according to the present invention, it is possible to reduce the deterioration of the frequency characteristics due to the substantially enlarged width of the base layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
   a collector layer of first conductive type formed on a semiconductor substrate;
   a graft base layer of second conductive type formed in a surface region of the collector layer;
   a first base leading-out region of second conductive type formed on the graft base layer;
   a second base leading-out region of second conductive type formed on an upper surface and a side surface of the first base leading-out region;
   a base layer of second conductive type formed on the collector layer;
   an emitter layer of first conductive type formed in a surface region of the base layer; and
   an emitter leading-out region formed on the emitter layer,
   wherein the base layer is also formed on the second base leading-out region, and at least part of an impurity concentration profile of the second base leading-out region is smaller than an impurity concentration of the first base leading-out region.

2. A semiconductor device according to claim 1, wherein the first and second base leading-out regions are made of the same material.

3. A semiconductor device according to claim 1, wherein the base layer is an epitaxial growth layer.

4. A semiconductor device according to claim 3, wherein the base layer is made of SiGe.

5. A semiconductor device, comprising:
   a collector layer of first conductive type formed on a semiconductor substrate;
   a graft base layer of second conductive type formed in a surface region of the collector layer;
   a first base leading-out region of second conductive type formed on the graft base layer;
   a second base leading-out region of second conductive type formed on an upper surface and a side surface of the first base leading-out region;
   a base layer of second conductive type formed on the collector layer;
   an emitter layer of first conductive type formed in a surface region of the base layer; and
   an emitter leading-out region formed on the emitter layer,
   wherein the first and second base leading-out regions are made of polycrystalline silicon and the base layer is made SiGe, and wherein an impurity concentration of the base layer is lower than that of the first base leading-out region, and an impurity concentration profile of the second base leading-out region is substantially a middle impurity concentration profile between the impurity concentrations of the first base leading-out region which is the lower layer and the base layer which is the upper layer.

* * * * *